US008164935B2

(12) United States Patent
Schuette et al.

(10) Patent No.: US 8,164,935 B2
(45) Date of Patent: Apr. 24, 2012

(54) MEMORY MODULES AND METHODS FOR MODIFYING MEMORY SUBSYSTEM PERFORMANCE

(75) Inventors: Franz Michael Schuette, Colorado Springs, CO (US); William J. Allen, Cupertino, CA (US)

(73) Assignee: OC2 Technology Group, Inc., San Jose, CA (US)

( * ) Notice: Subject to any disclaimer, the term of this patent is extended or adjusted under 35 U.S.C. 154(b) by 33 days.

(21) Appl. No.: 12/632,176

(22) Filed: Dec. 7, 2009

(65) Prior Publication Data

US 2010/0142247 A1 Jun. 10, 2010

Related U.S. Application Data

(60) Provisional application No. 61/120,119, filed on Dec. 5, 2008.

(51) Int. Cl.
*G11C 5/02* (2006.01)
*G11C 17/18* (2006.01)

(52) U.S. Cl. .......................................... 365/51; 365/229

(58) Field of Classification Search .................... 365/51, 365/230.03, 229

See application file for complete search history.

(56) References Cited

U.S. PATENT DOCUMENTS

| | | | |
|---|---|---|---|
| 5,757,712 A | | 5/1998 | Nagel et al. |
| 5,945,886 A | * | 8/1999 | Millar .............................. 333/1 |
| 6,122,185 A | * | 9/2000 | Utsunomiya et al. ........... 363/60 |
| 7,127,622 B2 | | 10/2006 | Schnepper |
| 7,360,104 B2 | * | 4/2008 | Harris et al. ................... 713/300 |
| 2005/0270891 A1 | * | 12/2005 | Flach et al. ..................... 365/233 |
| 2007/0267742 A1 | * | 11/2007 | Tai ................................. 257/728 |
| 2008/0247220 A1 | | 10/2008 | Yamaoka et al. |
| 2010/0135097 A1 | * | 6/2010 | Berke ............................. 365/226 |

OTHER PUBLICATIONS

Jedec, 1999, JESD67.*

* cited by examiner

*Primary Examiner* — Hoai V Ho
*Assistant Examiner* — Min Huang
(74) *Attorney, Agent, or Firm* — Hartman & Hartman, P.C.; Gary M. Hartman; Domenica N. S. Hartman

(57) ABSTRACT

Methods and memory modules adapted for use in computer systems to generate different voltages for core supply (VDD) and input/output supply (VDDQ) inputs to memory components of the computer memory subsystem. The memory module includes a substrate with an edge connector, a memory component, and first and second voltage planes adapted to supply the core supply voltage and the input/output supply voltage to the memory component. The first voltage plane receives a system input voltage from the edge connector, and the second voltage plane is connected to the first voltage plane to receive a second voltage that is either higher or lower than the system input voltage. One of the first and second voltage planes is connected to the memory component to supply the core supply voltage thereto, and the other voltage plane supplies the input/output supply voltage to the memory component.

20 Claims, 3 Drawing Sheets

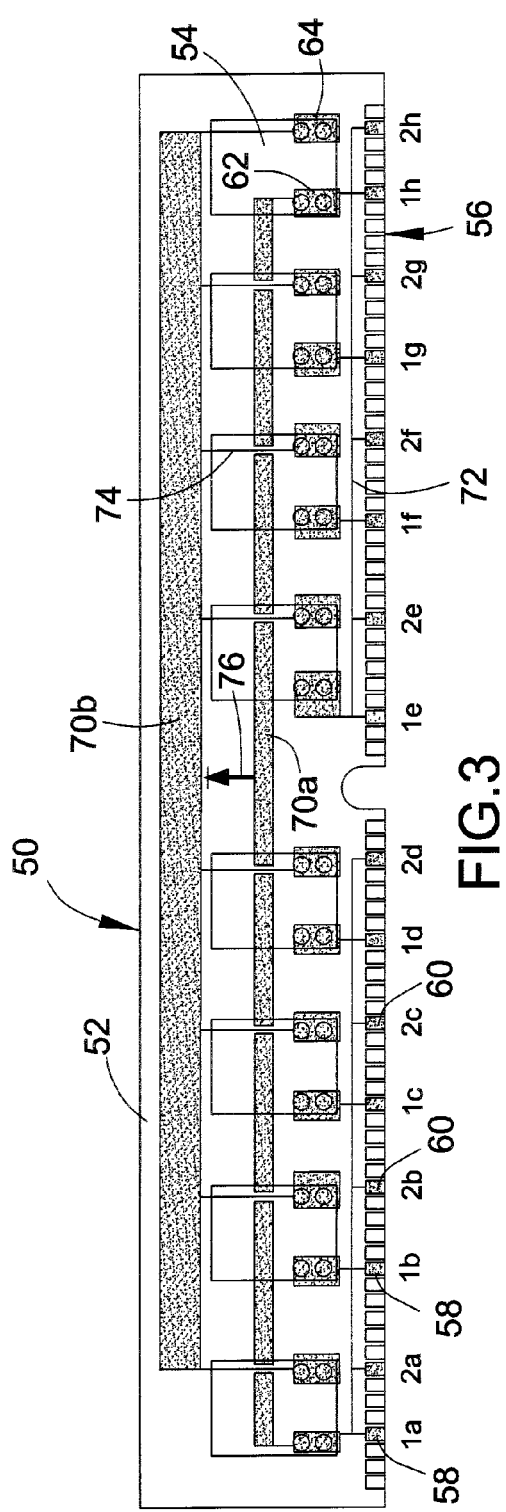
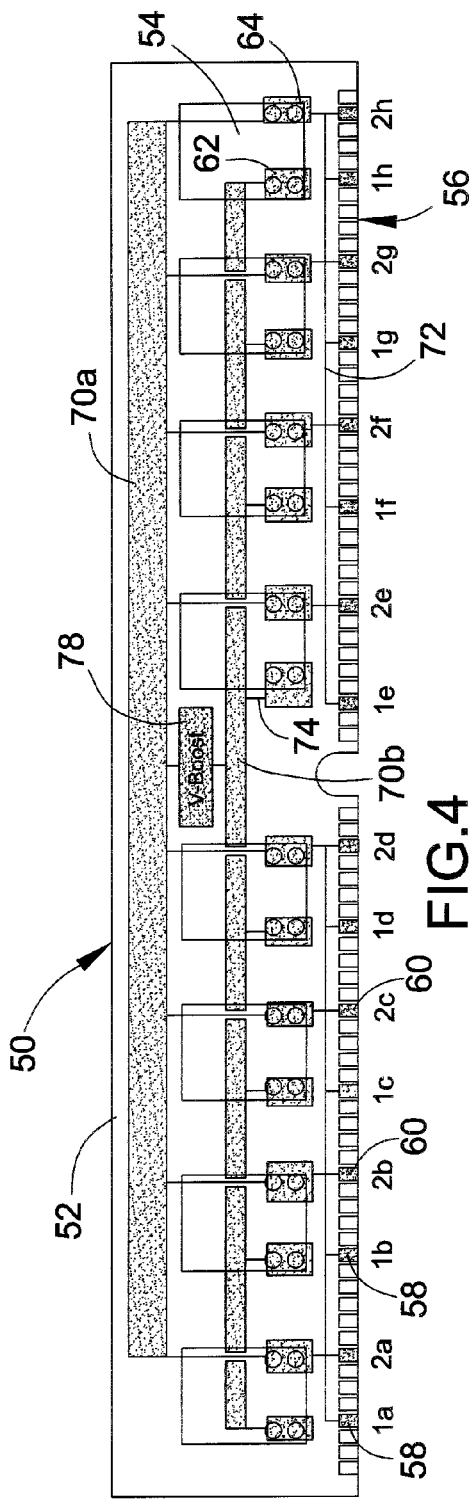

MEMORY MODULES AND METHODS FOR MODIFYING MEMORY SUBSYSTEM PERFORMANCE

CROSS REFERENCE TO RELATED APPLICATIONS

This application claims the benefit of U.S. Provisional Application No. 61/120,119, filed Dec. 5, 2008, the contents of which are incorporated herein by reference.

BACKGROUND OF THE INVENTION

The present invention generally relates to memory subsystems and related components of computer systems. More particularly, this invention relates to methods and circuitry for altering and preferably optimizing the performance of a memory subsystem by generating different voltages for VDD and VDDQ inputs to memory components of the memory subsystem.

System memory has become one of the performance bottlenecks in current computer configurations. Memory signaling frequencies are doubling roughly every five years in order to keep up with the increased bandwidth requirements of modern system architectures. At the same time, the supply voltage of the memory subsystem is lowered in the process of transitioning to smaller process nodes. However, a recurrent trend in the advancement of memory technology is that by the time of introduction of a new generation of DRAM, the requirements for the new components by far exceed the original design specifications. For example, DDR2 was originally conceived to run at approximately 400 MHz, however, shortly after its introduction, 533, 667 and 800 MHz speed grades had to be added in order to compete with the phasing-out first generation of DDR memory running as fast as 600 MHz at lower latency. A similar trend is seen in the case with DDR3 that was originally designed for 800 MHz with a high end speed grade of 1066 MHz, which within less than two months of its introduction into the marketplace was scaled up to 1600 MHz, and shortly thereafter to 2000 MHz.

Frequency and latencies are strongly dependent on the supply voltage. If the supply voltage is increased, it is possible in most cases to increase the frequency headroom of the design or the actual components. Likewise, some of the internal logic portions of the DRAM components are sensitive to voltage in the same sense. In particular, the Column Address Strobe (CAS) speed is highly dependent on the core supply voltage of the memory chip. Higher supply voltages result in faster column addressing and, as a consequence, the CAS delay or latency on most DRAM ICs can be reduced if higher voltages are used.

A drawback of increasing the DRAM supply voltage is that all current DRAM implementations in standard computer systems specify a single supply voltage plane for both the core voltage (VDD) and the input/output voltage ($V_{I/O}$ or VDDQ) on both the motherboard and memory circuit board level, even though the two power planes are separate on all current DRAM chip levels. A memory module 10 illustrating this is schematically represented in FIG. 1, in which VDD and VDDQ input pins 18 and 20 at an edge connector 16 of the module printed circuit board (PCB) 12 are connected through conductor traces or lines 26 and 28, respectively, to a common plane 30 that supplies the same voltage to VDD and VDDQ input pins 22 and 24 of the memory components (chips) 14 of the module 10. As a consequence, increasing the core supply (VDD) voltage of the memory chips 14 will also increase the I/O (VDDQ) voltage of the memory chips 14 and the I/O voltage on the memory controller (not shown) that manages the flow of data going to and from the module 10. Increasing the I/O voltage, however, can compromise the reliability of the memory controller. The sensitivity to overvoltage and the associated reliability problems become particularly important if the memory controller is integrated into the central processor unit (CPU), as in the current models offered by Advanced Micro Devices, Inc. (AMD) and Intel Corporation.

It is, therefore, desirable to increase the memory core voltage in order to increase internal frequency overhead and to speed up access times of the address strobes, while keeping the I/O voltage levels at the standard system specification. However, it is difficult to retroactively change designs of the power planes of motherboards in order to separate supply voltages for the DRAM core and I/O circuitry. Moreover, even if split voltage planes were implemented on the motherboard level, it would be negated by the shared voltage planes of the memory printed circuit boards (PCBs).

One possible solution for the above problem is to have additional voltage regulators on the memory PCB that use the supply voltage as reference and then selectively lower the I/O voltage by a pre-defined amount. In this case it is also advantageous that the termination voltage on the motherboard remains unchanged at one-half of the original supply voltage, since it has been empirically found that increasing the termination voltage of the I/O system above the center of the voltage swing increases performance, whereas lowering the termination voltage below the midpoint of the voltage swing is generally detrimental to performance.

A potential drawback of the lowered memory VDDQ is that the memory voltage is supplied not only to the memory but also to the I/O portion of the memory controller. Lowering the I/O voltage on the memory module level will, therefore, cause a voltage gradient between the memory controller and the memory device that can affect the signaling properties as well as cause reverse current flow into the memory chips through the bus interface.

A different approach is to selectively boost VDD up to the desired levels. One limitation to overcome in this situation is that most current memory designs utilize internal voltage regulators to keep the core voltage at a predefined level that is lower than the supply voltage. Depending on the quality and nature of the voltage regulators, the boost in core supply voltage must be higher than the target core voltage. However, because VDD and VDDQ are completely separated on the IC level, no unwanted bleeding over should occur, especially since boosting the core voltage will essentially even out the preexisting gradient between the core and I/O voltages.

Modifications of the supply voltage of the memory subsystem have been proposed as solutions for facilitating the transition between memory generations. For example, U.S. Pat. No. 5,757,712 teaches the use of a diode to lower the voltage supplied to the DRAM in order to ensure the compatibility of lower voltage DRAM integrated circuits with high voltage systems. In another embodiment, this patent teaches the use of bus switches to adjust the I/O voltage swing to the requirement of the system. U.S. Pat. No. 7,127,622 teaches storing the operational voltage value of the DRAM in a nonvolatile configuration memory, such as the serial presence detect ROM on a memory module, to allow the host to modify the memory supply voltage to the preferred voltage of the memory module. U.S. Published Patent Application No. 20080247220 describes an SRAM wherein the supply voltage is boosted during read operations.

BRIEF DESCRIPTION OF THE INVENTION

The present invention provides methods and memory modules adapted for use in a computer system to alter and preferably optimize the performance of a memory subsystem by generating different voltages for core supply (VDD) and input/output supply (VDDQ) inputs to memory components of the memory subsystem.

According to a first aspect of the invention, the memory module includes an edge connector on a substrate and having at least first and second input pins, at least one memory component mounted on the substrate and electrically interconnected with the edge connector to receive a core supply voltage and an input/output supply voltage, and first and second voltage planes defined on the substrate and adapted to supply the core supply voltage and the input/output supply voltage to the memory component. The first voltage plane is connected to the first and second input pins of the edge connector for receiving a system input voltage therefrom, and the second voltage plane is connected to the first voltage plane to receive a second voltage that is either higher or lower than the system input voltage of the first voltage plane. One of the first and second voltage planes is connected to the memory component to supply the core supply voltage thereto, and the other of the first and second voltage planes is connected to the memory component to supply the input/output supply voltage thereto.

According to a second aspect of the invention, a method is provided for supplying two different voltages to core supply input pins and input/output supply input pins of at least one memory component on a substrate of a memory module. The method includes configuring the substrate to have a first voltage plane that receives a system input voltage when the module is connected to a computer system, deriving the two different voltages from the system input voltage of the first voltage plane, delivering a first of the two different voltages to the core supply input pins of the memory component, and delivering a second of the two different voltages to the input/output supply input pins of the memory component.

In view of the above, it can be seen that technical effects associated with the invention include the ability to achieve a higher memory core supply voltage (VDD) as compared to the I/O supply voltage (VDDQ) on a memory module, which allows for higher frequency and latency yield without compromising the memory controller that manages the flow of data to and from the module. The ability to selectively boost the core supply voltage without increasing bus voltage avoids voltage level mismatch between the memory I/O and chipset I/O buffers. The invention also offers the advantage of an uncomplicated implementation at the memory module PCB level without requiring any redesign of existing motherboards, and avoids additional costs on the motherboard for implementing a separate memory VDD voltage regulator module.

Other aspects and advantages of this invention will be better appreciated from the following detailed description.

BRIEF DESCRIPTION OF THE DRAWINGS

FIG. 3 schematically represents an adaptation of the memory module of FIG. 2, in which the VDD and VDDQ input pins at the edge connector are tied together by a primary voltage plane that directly supplies voltage to the VDD input pins of the memory components, while a lower VDDQ input voltage is supplied to the memory components by a secondary voltage plane connected to the primary voltage plane through a diode.

FIG. 4 schematically represents a second adaptation of the memory module of FIG. 2, in which the VDD and VDDQ input pins at the edge connector are tied together by a primary voltage plane that directly supplies voltage to the VDDQ input pins of the memory components, while a higher VDD input voltage is supplied to the memory components by a secondary voltage plane connected to the primary voltage plane through a DC-DC voltage boost converter.

DETAILED DESCRIPTION OF THE INVENTION

FIGS. 2 through 5 schematically represent memory modules 50 configured to allow different supply voltages to be supplied to the core (VDD) and I/O portions (VDDQ) of memory components (chips) 54 on the modules 50. For convenience, consistent reference numbers are used throughout FIGS. 2 through 5 to identify the same or functionally equivalent elements.

Figure 1:
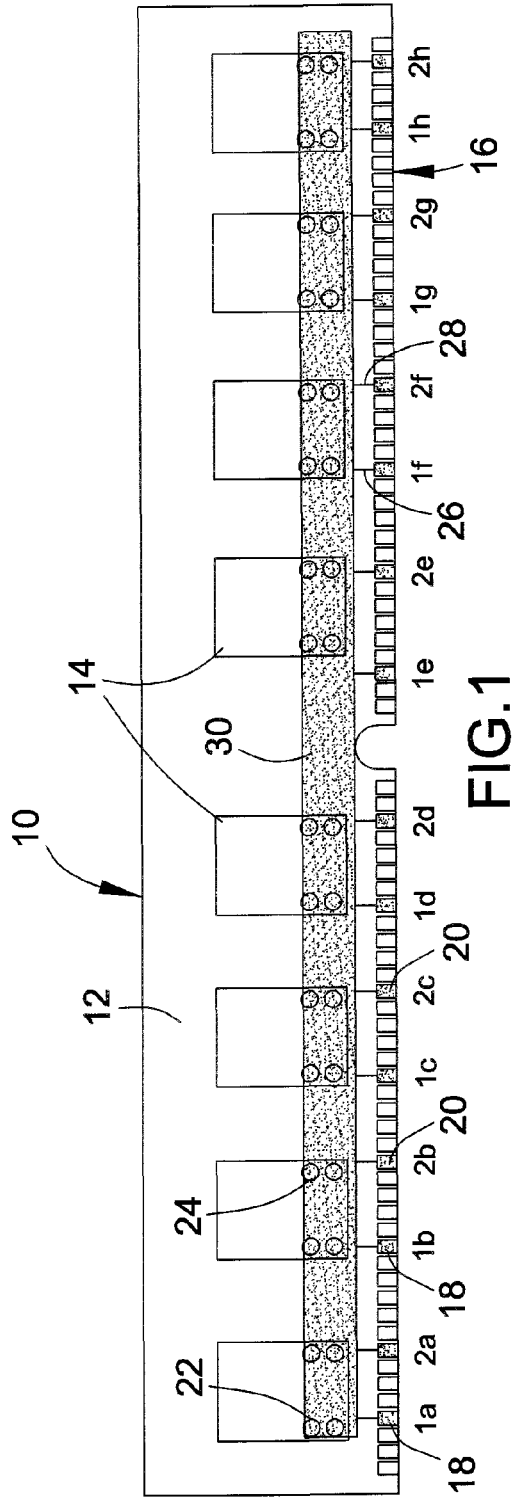
FIG. 1 schematically represents a memory module in which VDD and VDDQ input pins at an edge connector of the module are connected to a common plane that supplies the same voltage to VDD and VDDQ input pins of memory components on the module in accordance with the prior art.

Similar to the memory module 10 of FIG. 1, the memory chips 54 of each memory module 10 schematically represented in FIGS. 2 through 5 are mounted on a PCB 52 having an edge connector 56 comprising individual pins, some of which are VDD (core supply) input pins 58 and others are VDDQ (I/O) input pins 60. In contrast to the module 10 of FIG. 1, VDD and VDDQ input pins 62 and 64 of the chips 54 are not at the same voltage as a result of being connected to the pins 58 and 60 through a common voltage plane, but instead receive their voltage from primary and secondary voltage planes 70a and 70b on the PCB 52. The voltage planes 70a and 70b are de-coupled so that the VDD voltage of the memory chips 54 can be higher than the VDDQ voltage of the memory chips 54 without affecting the I/O voltage on the memory controller (not shown) that manages the flow of data going to and from the modules 50.

Figure 2:
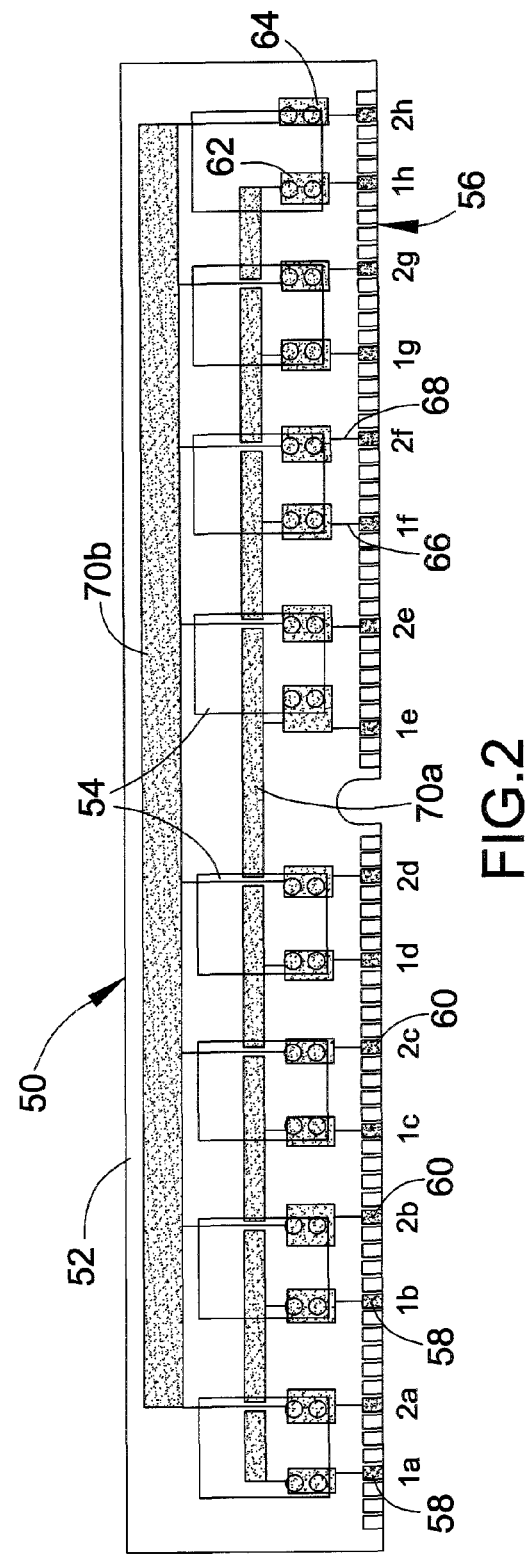
FIG. 2 schematically represents a memory module corresponding to the type shown in FIG. 1, but with VDD and VDDQ input pins at the edge connector of the module separately connected to VDD and VDDQ input pins on the memory components through separate voltage planes.

In FIG. 2, the VDD and VDDQ input pins 58 and 60 are connected by traces or lines 66 and 68, respectively, to the primary and secondary voltage planes 70a and 70b, respectively, so that the VDD input pins 58 exclusively supply the core supply voltage to the VDD input pins 62 of the memory chips 54 and the VDDQ input pins 60 exclusively supply the I/O supply voltage to the VDDQ input pins 64 of the memory chips 54. As a result, the VDD and VDDQ supply voltages of the chips 54 are completely separate on the level of the PCB 52, that is, the lines 66 and 68 for VDD and VDDQ are completely independently routed from each other between the edge connector 56 to the input pins 62 and 64 on the memory chips 54.

Figure 5:
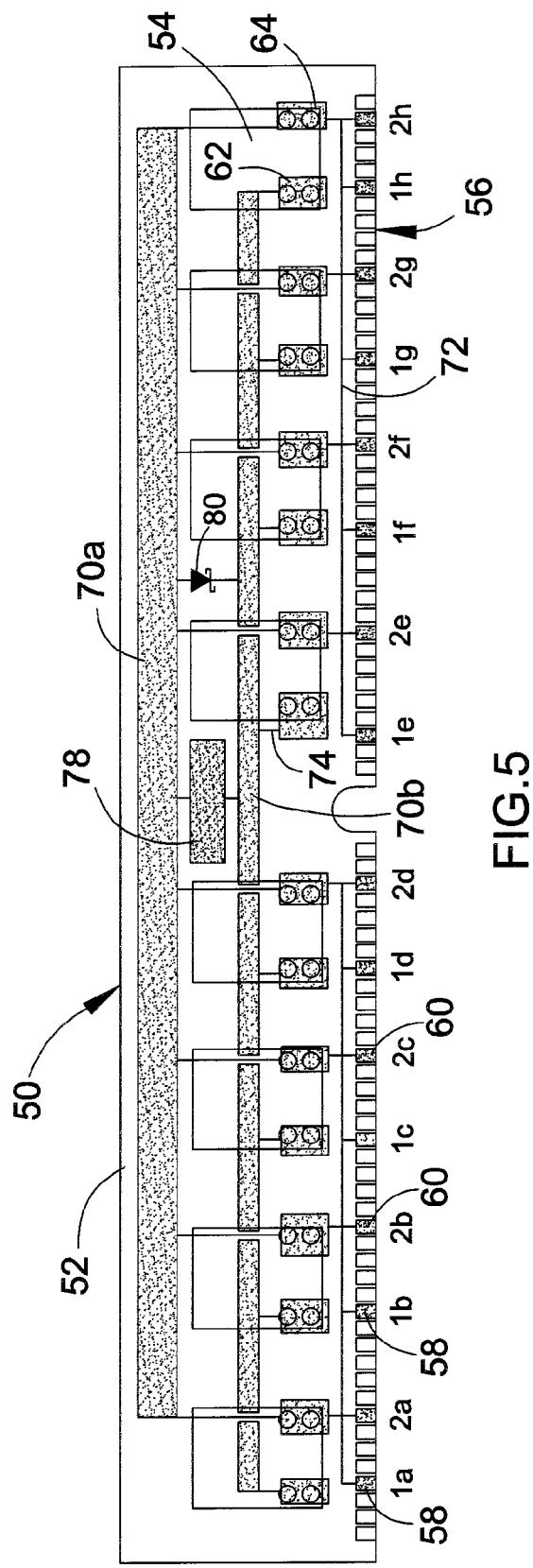
FIG. 5 schematically represents a further adaptation of the memory module of FIG. 4, in which a Schottky diode connects the primary and secondary voltage planes to limit voltage differentials between the voltage planes that may arise from a delayed power-up of the boost converter.

The embodiment of FIG. 2 necessitates separate VDD and VDDQ voltages to the edge connector 56 in order for the VDD voltage of the memory chips 54 to be higher than the VDDQ voltage of the memory chips 54. In the embodiments of FIGS. 3 through 5, the VDD and VDDQ input pins 58 and 60 of the edge connector 56 are tied to the primary voltage plane 70a, but the VDD and VDDQ input pins 62 and 64 of the chips 54 are at different voltage levels as a result of one set of pins 62 or 64 being tied to the primary voltage plane 70a, the other set of pins 62 or 64 being tied to the secondary voltage plane 70b, and the voltage planes 70a and 70b being at different voltage levels. With the VDD and VDDQ input pins 62 and 64 separately tied to the voltage planes 70a and 70b, a reduction in VDDQ or a boost in VDD seen at the chips 54 can be accomplished relative to a system input voltage supplied to the VDD and VDDQ input pins 58 and 60 of the edge connector 56. As a result, the embodiments of FIGS. 3 through 5 eliminate the need for separate and different VDD and VDDQ voltages supplied to the pins 58 and 60 of the edge connector 56 in order for the VDD voltage of the memory chips 54 to be higher than the VDDQ voltage of the chips 54.

In FIG. 3, the VDD and VDDQ input pins 58 and 60 are tied by lines 72 to the primary voltage plane 70a, so that the VDD and VDDQ input pins 58 and 60 are at the same system input voltage. The lines 72 directly connect the VDD input pins 62 of the memory chips 54 to the primary voltage plane 70a, whereas the VDDQ input pins 64 of the chips 54 are directly connected with lines 74 to the secondary voltage plane 70b, which is connected to the primary voltage plane 70a through a diode 76. With this approach, a reduction in VDDQ at the VDDQ input pins 64 of the chips 54 is accomplished relative to the voltage level at the VDD and VDDQ input pins 58 and 60 of the edge connector 56.

In FIGS. 4 and 5, the VDD and VDDQ input pins 58 and 60 are again tied by lines 72 to the primary voltage plane 70a, so that the VDD input pins 58 and 60 are at the same system input voltage. However, the lines 72 directly connect the VDDQ input pins 64 of the memory chips 54 to the primary voltage plane 70a, and the VDD input pins 62 of the chips 54 are directly connected with lines 74 to the secondary voltage plane 70b. A voltage differential between the two voltage planes 70a and 70b is accomplished with boost circuitry 78 that increases the core voltage of the secondary voltage plane 70b relative to the primary voltage plane 70a. In FIG. 5, a diode 80 is further included to limit any delay or voltage lag between the primary (VDDQ) and secondary (VDD) voltage planes 70a and 70b caused by a delay in power up of the boost circuitry 78. With either approach, a boost in VDD at the VDD input pins 62 of the chips 54 is accomplished relative to the voltage level at the VDD and VDDQ input pins 58 and 60 of the edge connector 56.

In view of the above, the invention provides modifications to the memory module PCB 52 to add integrated circuitry for the purpose of generating different voltages for VDD and VDDQ input to the memory chips 54 mounted on the PCB 52. Modifications to the edge connector 56 of the PCB 52 are unnecessary, since memory module PCBs conventionally contain power and ground pins that are assigned to VDD and VDDQ. However, prior art memory module PCBs consolidate the two voltages into a common voltage plane (30 in FIG. 1) since there has been no need to separate and isolate them. Instead, conventional memory chips typically include internal voltage regulators that derive the desired core voltage from the unified input voltage of a common voltage plane, and this core voltage is typically lower than the input voltage at the edge connector to minimize power consumption and thermal dissipation. While both factors are important in the OEM market space, in the high performance specialty market this core voltage reduction reduces yields at higher than nominally specified frequencies.

Aside from the CPU voltage regulator or voltage regulator module (VRM), motherboards feature separate VRMs to generate different supply voltages for buses and components such as core logic of the memory subsystem. With respect to the memory subsystem, a typical design features a common voltage plane that powers the memory VDD and VDDQ inputs on the memory slots as well as the I/O portion of the memory controller. At least VDDQ on the memory and on the memory controller should match, though small voltage level differences may be tolerated. A third derivative of the same voltage is typically the DLL voltage for the memory chips, however, in typical current designs VDDLL is also tied to the common VDD/VDDQ plane. Another important voltage to consider is the termination voltage (VTT) on the motherboard, which is usually tied to the memory reference Voltage (VRef) and typically set to one-half of VDDQ.

Because of the dependency of VTT/VRef on VDDQ, as well as the fact that VDDQ at the chip (VDDQ(mem)) and VDDQ at the memory controller (VDDQ(memctrl)) need to match, a selective lowering of VDDQ on the memory module 50 as done in FIG. 3 may not be preferred in some cases, though it may be practical as long as the differential between VDDQ(memctrl) and VDDQ(mem) is small enough to not cause any level shift effects. These issues aside, VDDQ could be lowered by using a simple resistor in the supply path. However, the voltage drop would depend on the overall power draw with the undesired side effect that under load, according to Ohm's law, the I/O voltage would drop more than in idle conditions. Accordingly, FIG. 3 represents a more precise approach to accomplishing a specified reduction in VDDQ (I/O) voltage with the use of the diode 76 to maintain a consistent voltage drop across all levels of load and power draw. Alternatively, it is foreseeable that a linear regulator circuit of a known type in the art could be employed in place of the diode 76 to achieve an equivalent reduction in VDDQ voltage. It is believed that voltage differentials of about 0.2 to about 0.4 volts can be achieved with the embodiment of FIG. 3, with the understanding that acceptable and potential voltage differentials will depend in part on the default voltage of the memory subsystem.

A preferred approach to achieving a core voltage that is higher than the I/O voltage is believed to be the embodiments of FIGS. 4 and 5, in which the VDD (core) voltage is boosted and the VDDQ (I/O) voltage and all dependent voltages like VTT and VRef are unaffected. In FIGS. 4 and 5, this approach is accomplished by splitting off the secondary voltage plane 70b and using a DC-DC converter as the boost circuitry 78 to increase the voltage level on the secondary voltage plane 70b and, consequently, increase the VDD input to the memory chips 54. Depending on the actual design, the VDD voltage on the secondary voltage plane 70b can be generated using a monolithic DC-DC converter containing inductors and a switch (not shown). Alternatively, inductors can be integrated into the traces of the PCB 52 and a separate switch can be used to generate the oscillations. Voltage ripples stemming from the switching events can be buffered by capacitors.

DC-DC boost converters usually have a certain start-up time, which can result in a lag of VDD supply compared to VDDQ, potentially resulting in a pronounced voltage differential between the two planes 70a and 70b upon startup. This differential can have averse effects on the power-up sequence of the chips 54 and/or may cause forward current into the core from the I/O, potentially damaging the chip 54. This situation can be avoided with the addition of the diode 80 between the voltage planes 70a and 70b to limit the delay and voltage lag between the primary (VDDQ) voltage plane 70a and the secondary (VDD) voltage plane 70b. At the same time, the rectification provided by the diode 80 prevents the higher voltage of the secondary (VDD) power plane 70b to feed back into the primary (VDDQ) voltage plane 70a and negate the desired voltage boost. Because of its very rapid switching action and lower forward voltage drop, the diode 80 is preferably a Schottky diode in the embodiment of FIG. 5. It is believed that voltage boosts of up to about 30% of the system input voltage can be achieved with the embodiments of FIGS. 4 and 5 without exceeding the power envelope of a memory voltage regulator module on motherboards currently used in the industry.

While the invention has been described in terms of specific embodiments, it is apparent that other forms could be adopted by one skilled in the art. For example, the physical configuration of the memory modules 50, chips 54, edge connectors 56, voltage planes 70a and 70b, and conductor lines 72 and 74 could differ from that shown, as evidenced by the diversity of these components in the computer industry. In addition, while the description and drawings make reference to PCBs, the invention is not limited to any particular substrate, but instead encompasses any substrate suitable for use in memory modules. Therefore, the scope of the invention is to be limited only by the following claims.

The invention claimed is:

1. A memory module adapted for use in a computer system having a system input voltage, the module comprising:
   a substrate;
   an edge connector on the substrate and comprising at least first and second input pins adapted to receive the system input voltage from the computer system;
   electrical connections on the substrate that tie the first and second input pins so that a voltage applied to one of the first and second input pins is also applied to the other of the first and second input pins;
   at least one memory component mounted on the substrate and electrically interconnected with the edge connector to receive a core supply voltage and an input/output supply voltage; and
   first and second voltage planes defined on the substrate and adapted to supply the core supply voltage and the input/output supply voltage to the memory component, the first voltage plane being connected to the first and second input pins of the edge connector for receiving the system input voltage therefrom, and the second voltage plane being connected through a voltage-altering device to the first voltage plane to receive a second voltage that is either higher or lower than the system input voltage of the first voltage plane, wherein one of the first and second voltage planes is connected to the memory component to supply the core supply voltage thereto and the other of the first and second voltage planes is connected to the memory component to supply the input/output supply voltage thereto.

2. The memory module of claim 1, wherein the input/output supply voltage is lower than the core supply voltage.

3. The memory module of claim 1, wherein the second voltage of the second voltage plane is lower than the system input voltage of the first voltage plane.

4. The memory module of claim 3, wherein the first voltage plane supplies the core supply voltage to the memory component, and the second voltage planes supplies the input/output supply voltage to the memory component.

5. The memory module of claim 4, wherein the core supply voltage is equal to the system input voltage of the first voltage plane, and the input/output supply voltage is equal to the second voltage of the second voltage plane.

6. The memory module of claim 3, wherein the voltage-altering device comprises a diode connecting the first and second voltage planes and adapted to reduce the second voltage of the second voltage plane relative to the system input voltage of the first voltage plane.

7. The memory module of claim 3, wherein the voltage-altering device comprises a linear regulator circuit connecting the first and second voltage planes and adapted to reduce the second voltage of the second voltage plane relative to the system input voltage of the first voltage plane.

8. The memory module of claim 1, wherein the second voltage of the second voltage plane is higher than the system input voltage of the first voltage plane.

9. The memory module of claim 8, wherein the first voltage plane supplies the input/output supply voltage to the memory component, and the second voltage planes supplies the core supply voltage to the memory component.

10. The memory module of claim 9, wherein the input/output supply voltage is equal to the system input voltage of the first voltage plane, and the core supply voltage is equal to the second voltage of the second voltage plane.

11. The memory module of claim 8, further comprising a boost DC-DC converter between the first and second voltage planes and adapted to boost the second voltage of the second voltage plane relative to the system input voltage of the first voltage plane.

12. The memory module of claim 11, further comprising a Schottky diode connecting the first and second voltage planes and adapted to limit delays and voltage lags between the first and second voltage planes.

13. A method of supplying two different voltages to at least one core supply input pin and at least one input/output supply input pin of at least one memory component on a substrate of a memory module that receives a system input voltage from a computer system, the method comprising:
   configuring the substrate to have a first voltage plane and first and second input pins to which the first voltage plane is connected so that a voltage applied to one of the first and second input pins is also applied to the other of the first and second input pins and to the first voltage plane;
   connecting the module to the computer system so that the first voltage plane receives the system input voltage from the computer system through the first and second input pins;
   deriving the two different voltages from the system input voltage of the first voltage plane;
   delivering a first of the two different voltages to the core supply input pin of the memory component; and
   delivering a second of the two different voltages to the input/output supply input pin of the memory component.

14. The method of claim 13, wherein the second of the two different voltages is lower than the first of the two different voltages.

15. The method of claim 14, wherein the first of the two different voltages is equal to the system input voltage of the first voltage plane.

16. The method of claim 14, wherein the second of the two different voltages is derived from the system input voltage by a voltage drop across a diode or a linear regulator circuit.

17. The method of claim 14, wherein the second of the two different voltages is equal to the system input voltage of the first voltage plane.

18. The method of claim 14, wherein the second of the two different voltages is derived from the system input voltage from a voltage boost of the system input voltage.

19. The method of claim 18, further comprising configuring the substrate to have a second voltage plane that receives the second of the two different voltages from the first voltage plane.

20. The method of claim 19, further comprising connecting a Schottky diode between the first and second voltage planes to limit delays and voltage lags between the first and second voltage planes.

* * * * *

UNITED STATES PATENT AND TRADEMARK OFFICE
CERTIFICATE OF CORRECTION

PATENT NO. : 8,164,935 B2  Page 1 of 1
APPLICATION NO. : 12/632176
DATED : April 24, 2012
INVENTOR(S) : Franz Michael Schuette et al.

It is certified that error appears in the above-identified patent and that said Letters Patent is hereby corrected as shown below:

Title Page:

(73) Assignee: "OC2 Technology Group, Inc." should be amended to:

-- OCZ Technology Group, Inc. --

Signed and Sealed this
Nineteenth Day of June, 2012

David J. Kappos
*Director of the United States Patent and Trademark Office*